United States Patent [19]

Tanaka et al.

[11] Patent Number: 5,315,482
[45] Date of Patent: May 24, 1994

[54] SEMICONDUCTOR APPARATUS OF MODULE INSTALLING TYPE

[75] Inventors: Akira Tanaka; Hiroichi Shinohara; Kazuji Yamada, all of Hitachi; Takao Ohba, Hadano; Akira Yamagiwa, Hadano; Hitoshi Yoshidome, Hadano; Yuji Shirai, Kodaira; Toshio Hatada, Tsuchiura; Munehisa Kishimoto, Kamakura; Michiharu Honda, Yokohama, all of Japan

[73] Assignee: Hitachi, Ltd., Tokyo, Japan

[21] Appl. No.: 961,394

[22] Filed: Oct. 15, 1992

[30] Foreign Application Priority Data

Oct. 21, 1991 [JP] Japan .................... 3-272330

[51] Int. Cl.[5] .............................. H05K 7/20
[52] U.S. Cl. ..................... 361/707; 257/707; 361/764
[58] Field of Search ............ 174/16.3, 252; 361/383, 361/386–388, 401, 406, 414, 689, 690, 702, 704, 707, 709, 761, 764, 774, 792; 165/80.3, 185; 257/693, 700, 706, 707, 713, 722

[56] References Cited

U.S. PATENT DOCUMENTS

| | | | |
|---|---|---|---|
| 4,630,172 | 12/1986 | Stenerson | 361/386 |
| 4,860,165 | 8/1989 | Cassinelli | 361/388 |
| 4,982,311 | 1/1991 | Dehaine | 361/388 |
| 5,012,386 | 4/1991 | McShane | 361/386 |
| 5,130,889 | 7/1992 | Hamburgen | 361/388 |
| 5,191,511 | 3/1993 | Sawaya | 361/401 |

OTHER PUBLICATIONS

Electronic Packaging Technology, Hitachi, vol. 6, No. 3, Mar. 1990, pp. 57–60.

Primary Examiner—Gerald P. Tolin
Attorney, Agent, or Firm—Antonelli, Terry, Stout & Kraus

[57] ABSTRACT

A semiconductor apparatus comprises a heat diffusing plate and a surface installing printed board. A semiconductor device of a high heat generation is installed on the heat diffusing plate. A surface installing package and chip parts are installed on both surfaces of the printed board. A through hole is formed at the center of the printed board so that the semiconductor device is located at the center. The heat diffusing plate on which the semiconductor device has been installed and the surface installing printed board are connected and integrated.

10 Claims, 5 Drawing Sheets

FIG. IA
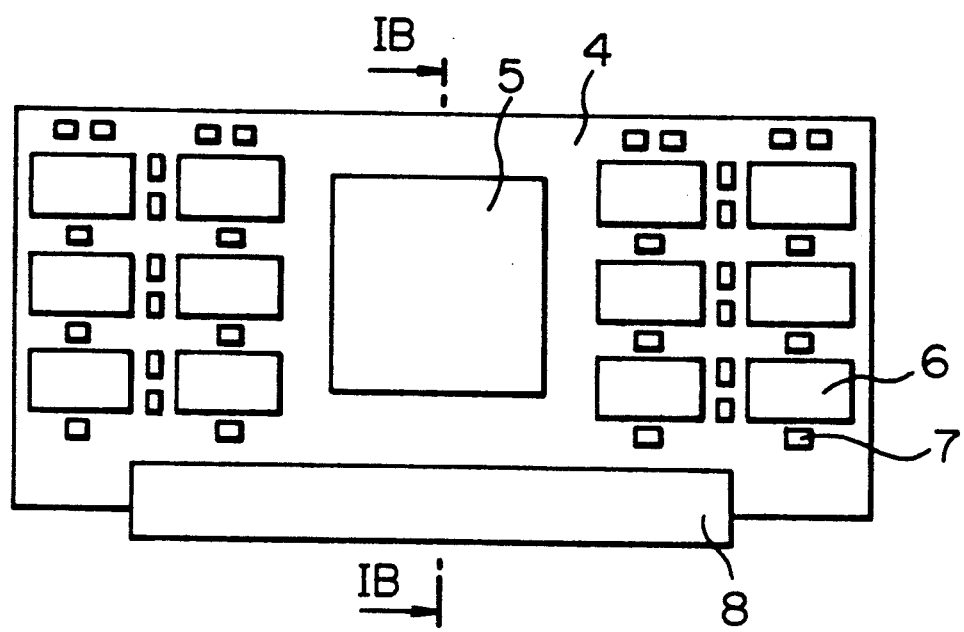
FIG. IB
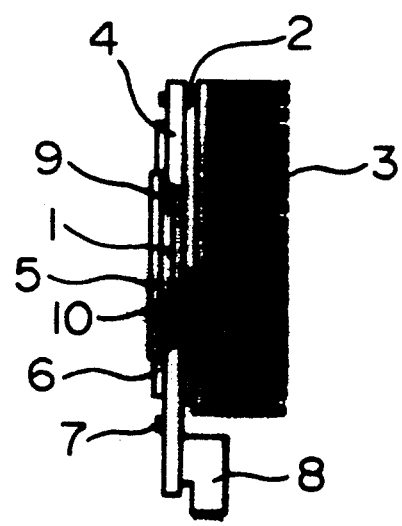

5,315,482

SEMICONDUCTOR APPARATUS OF MODULE INSTALLING TYPE

BACKGROUND OF THE INVENTION

The invention relates to an installing technique of a computer and, more particularly, to a semiconductor apparatus of the module installing type which is suitable for a high density installation of semiconductor devices.

In recent years, as a result of an increased demand for a computer with higher processing speeds, in which semiconductor devices are installed therein, and, further, for greater miniaturization of a casing, development has been towards the realization of a high integration of the semiconductor devices and a large size is being progressed year by year. In association with them, there is a tendency such that the number of input and output terminals per semiconductor device and an amount of heat generation also increase. Therefore, the realization of a high processing speed, a small size, and a high heat radiating performance of a package form to install semiconductor devices is also required. For this purpose, a module installing form in which a plurality of semiconductor devices are installed on one substrate is used.

In a conventional module installing form, a semiconductor device chip is directly connected onto a printed board and a potting is performed by using a resin. However, since the printed board is formed by the resin of a small heat conductivity, the heat radiating performance is low and it is difficult to install semiconductor devices which generate a large heat.

As a method of improving the heat radiating performance of the package of the semiconductor device chip, there is a method disclosed in "Electronic Packaging Technology", Vol. 6, No. 3, page 60, FIG. 3, Mar., 1990. However, such a method intends to improve the heat radiating performance of the sole package unit and cannot solve the foregoing problem of the semiconductor apparatus of the module installing type.

SUMMARY OF THE INVENTION

It is an object of the invention to provide a semiconductor apparatus having a module installing structure which can solve the above problems and can accomplish the requirements for a high processing speed, a small size, and a high heat radiating performance.

The above object is accomplished by integratedly connecting a printed board for surface installation and a heat diffusing plate on which semiconductor devices are installed.

By integratedly connecting a surface installing printed board and a heat diffusing plate on which semiconductor devices are installed, the semiconductor devices of a high heat generation and a surface installing package can be installed in one module, so that a computer can be miniaturized. In addition, since the distance between the semiconductor devices can be reduced, electric characteristics such as an inductance and the like and a propagation delay time can be reduced.

According to the invention, by integratedly connecting the surface installing printed board and the heat diffusing plate on which semiconductor devices are installed, the semiconductor devices of a high heat generation of 5 W or more and the surface installing package can be installed into one module, so that the computer can be miniaturized. Since the distance between the semiconductor devices can be reduced, an electronic apparatus in which electric characteristics such as an inductance and the like and a propagation delay time of a signal are small can be provided.

BRIEF DESCRIPTION OF THE DRAWINGS

FIG. 1A is a plan view showing the first embodiment of the invention;

FIG. 1B is a cross sectional view showing the first embodiment of the invention;

DESCRIPTION OF THE PREFERRED EMBODIMENTS

Embodiment 1

Figure 2A:
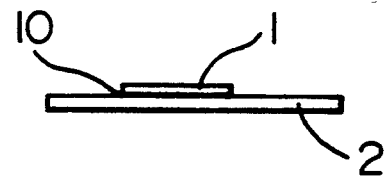
FIGS. 2A to 2E are diagrams showing manufacturing steps of a semiconductor apparatus of the invention.
Figure 2B:
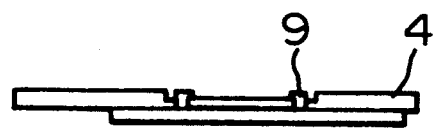
Figure 2C:
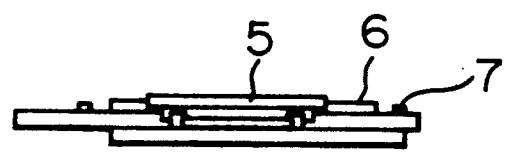
Figure 2D:
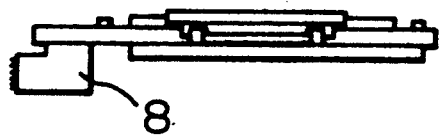
Figure 2E:

FIG. 1A is a plan view showing the first embodiment of the invention and FIG. 1B is a cross sectional view taken along the line IB—IB in FIG. 1A. A through hole is formed at the center of a surface installing printed board 4. A semiconductor device 1 is arranged in the through hole. The semiconductor device 1 comprises a circuit for effecting a logic function. A semiconductor device of a package for a memory on the surface of the printed board 4 is a memory device. The semiconductor device 1 is adhered to a heat diffusing plate 2 by an adhesive material 10. The heat diffusing plate 2 is made of a material of copper. Since a heat conductivity of copper is relatively large, i.e. about 400 W/mK, the heat generation from the semiconductor device 1 can be sufficiently spread and can be propagated to radiating fins 3 adhered to the heat diffusing plate 2. Although copper is used as a material of the heat diffusing plate 2, it is also possible to use a material of a type having a high enough heat conductivity, such as metal material including aluminum or the like, ceramics of a high heat conductivity such as aluminum nitride, silicon carbide, etc., or the like, other than the copper material so long as it can sufficiently transfer the heat generation of the semiconductor device 1 to the radiating fins 3. Although the semiconductor device 1 has been adhered to the heat diffusing plate 2 by the resin in the above example, in case of silicon carbide, aluminum nitride, or the like whose heat expansion coefficient is near that of the semiconductor device 1 made of silicon, the semiconductor device can be also fixed by disposed by soldering. As a material of the semiconductor device 1, a material such as GaAs or the like, other than silicon, is also considered. It is desirable that the heat diffusing plate to connect the semiconductor device has a coefficient close to the heat expansion coefficient of the semiconductor device. Although the radiating fins 3 have been adhered to the heat diffusing plate 2 by the resin, in order to enable the radiating fins 3 to be easily exchanged, it is also possible to construct in a manner such that screws or the like are fixed to the heat diffusing plate 2 and the radiating fins 3 are mechanically connected to the heat diffusing plate by the screws. In this instance, a soft heat transfer sheet can be also sandwiched between the heat diffusing plate 2 and the radiating fins 3 in order to efficiently perform the heat transfer. The radiating fins 3 are parallel flat package type fins and are projected to the upper portion of a memory package 6 installed on the printed board 4. Although the parallel flat package type fins have been used here, when high heat radiating fins of the pin type or the like are used as radiating fins 3, there is no need to project the fins to the upper portion of the package 6 installed on the printed board 4. The heat diffusing plate 2 on which the semiconductor device 1 is installed is adhered to the printed board 4 by the resin and is integrated. Signal input or output terminals of a semiconductor device which is installed on the printed board 4 are electrically connected to signal input or output terminals of the semiconductor device 1 arranged in the through hole of the printed board 4. The pads for electric wiring of the semiconductor device 1 and the printed board 4 are mutually electrically connected by wires 9. They can be also electrically connected by using a film-shaped member including a conductive layer in place of the wires. A dent in which the semiconductor device of the printed board 4 is installed is covered by a cap 5 in order to protect the semiconductor device 1. The printed board 4 is made of a polyimide resin. It is also possible to use a resin such as a glass epoxy resin or the like in which a multilayer wiring can be performed in place of the polyimide resin. The printed board 4 includes a plurality of conductive layers therein. The conductive layers comprise a plurality of power source layers, ground layers, and signal layers. Excluding the surfaces, the signal layers are sandwiched by the power source or ground layers and are arranged. The signal layer is formed on the conductive layer which is nearest to the surface. Although the thicknesses of all of the conductive layers are set to be almost equal, it is also possible to form the power source or ground layer thicker than the signal layer in order to raise the heat transfer performance. By increasing an amount of content of copper of the conductive layer, the conductive layer in the surface installing printed board is used as a heat exchanger plate, so that a temperature distribution in the printed board 4 can be held within ±10° C. A plurality of packages 6 and chip parts 7 such as capacitor, resistors, and the like are installed on the front and back surfaces of the printed board 4. In a part of the wiring circuit of the printed board 4, through holes or electrode pads to execute an operation test of the semiconductor device 1 and a conduction test of a wiring path of the printed board 4 are formed on one of the surfaces of the printed board 4. Due to this, performance tests of the module installing type semiconductor apparatus of the invention can be easily performed in a lump. A connector 8 is provided to electrically connect to the outside. An average length of the pins of the connector 8 lies within a range of ±10%, so that a variation of inductance components of the connector portion is small and an electrically stable structure is obtained. Diameters of the pins for the power source and the ground of the connector are larger than a diameter of each pin for signal, thereby providing a structure which is effective to a power source voltage fluctuation. The connector 8 is attached on the same side as that of the radiating fins 3 of the printed board 4. Therefore, a stress which is applied to the connector is small and a structure which is balanced with respect to the weight is derived.

FIGS. 2A to 2E show an example of the manufacturing steps of the semiconductor apparatus of the invention.

Step (1)

The semiconductor device 1 is adhered to the heat diffusing plate 2 having the smooth surface by the adhesive material 10 consisting of a resin.

Step (2)

The surface installing printed board 4 having the through hole in the portion in which a semiconductor device is installed is adhered to the heat diffusing plate 2 on which the semiconductor device 1 has been installed. The bonding pads of the semiconductor device 1 and the bonding pads of the printed board 4 are connected by wires.

Step (3)

To protect the semiconductor device 1, the semiconductor device 1 is covered by gel and, after that, it is covered by the cap 5. After a soldering paste was printed, the chip parts 7 are installed, the package 6 is subsequently installed, and a reflow soldering is executed.

Step (4)

The connector 8 as a part to be inserted is jointed to the printed board 4.

Step (5)

The fins 3 are attached onto the heat diffusing plate 2, so that the semiconductor apparatus of the module installing type is obtained.

Figure 3:
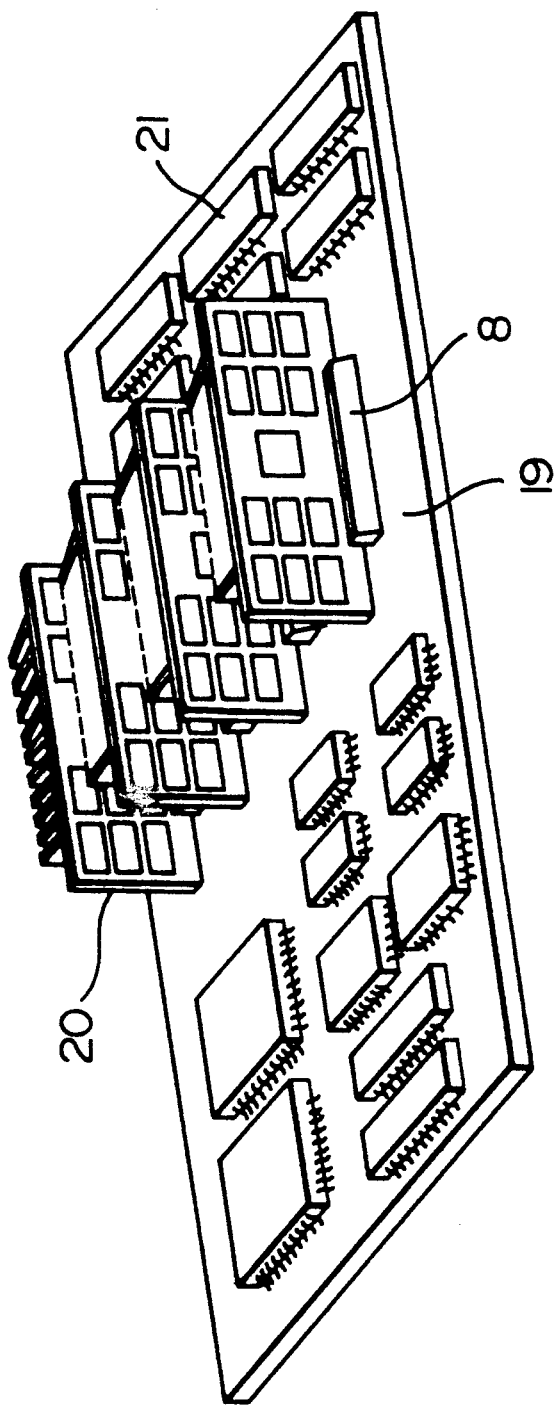
FIG. 3 is a perspective diagrammatical view of a mother board using the semiconductor apparatus of the invention.

As shown in FIG. 3, a module installing type semiconductor apparatus 20 obtained as mentioned above is electrically connected onto a mother board 19 by the connector 8. Reference numeral 21 in FIG. 3 denotes a surface installing part.

Figure 4A:
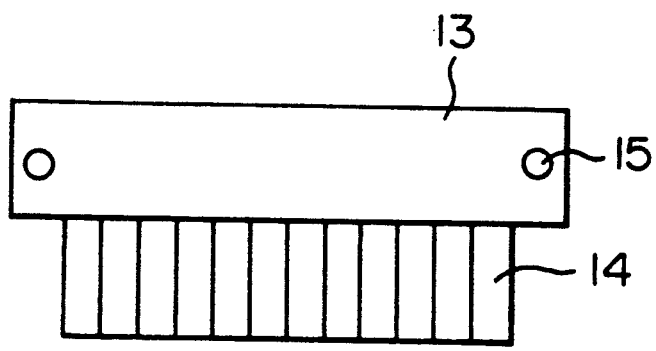
FIG. 4A is a schematic plan view of a squeegee for printing which is used when the semiconductor apparatus of the invention is manufactured.
Figure 4B:
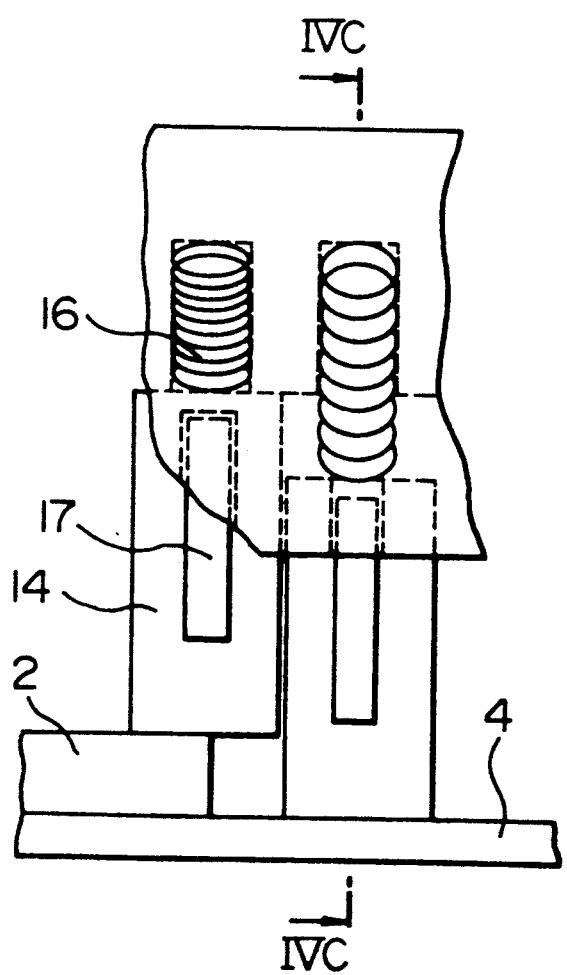
FIG. 4B is an enlarged perspective diagrammatical view of FIG. 4A.
Figure 4C:
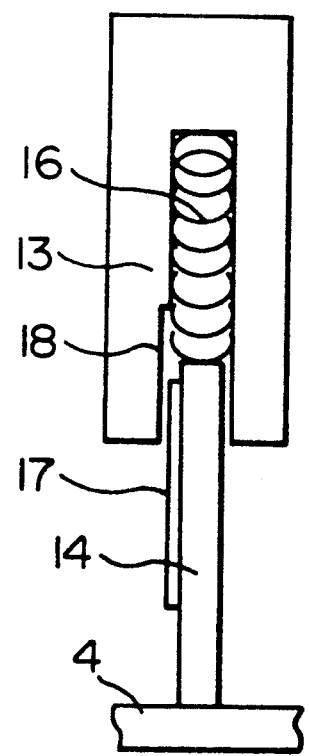
FIG. 4C is a cross sectional diagrammatical view of FIG. 4B.

In the above manufacturing steps, the semiconductor device 1 is not adhered onto the surface of the printed board 4 but is adhered to the heat diffusing plate 2. Therefore, the semiconductor device 1 is not inclined by a camber or swell of the printed board 4 and the device 1 can be certainly connected by the wires 9. Since the fins 3 can be directly adhered to the heat diffusing plate 2 on which the semiconductor device 1 has been installed, the fins 3 can efficiently radiate the heat generated from the semiconductor device 1. Since the cap 5 is put over the printed board 4, although it is projected from the surface of the printed board 4, it is also possible to construct in a manner such that a dent of a depth corresponding to only the thickness of the cap is formed in the printed board 4 and the cap 5 is buried into the dent, thereby enabling the surface to be made flat. By burying the cap, it is possible to easily print the soldering paste for the chip parts 7 and package 6 as surface installing parts. In the invention, in order to make a thickness of printed board 4 thin, the cap is not buried but is attached so as to be projected over the surface. Therefore, in order to be able print, at a time, the printed board 4 which as a rough surface, i.e. a rugged surface with height differences a squeegee 14 of a structure as shown in FIGS. 4A, 4B, and 4C is used. The squeegee 14 which has been made fine like a short fence is sandwiched by the pressing action of a squeegee pressing tool 13 and a screw. The squeegee pressing tool 13 has a structure as shown in FIGS. 4B and 4C. FIG. 4C is a cross sectional view taken along the line IVC—IVC in FIG. 4B. The squeegee 14 which has been made fine can be moved in the vertical direction, corresponding to a direction of the thickness of the printed board 4, by a spring 16. A squeegee guide 17 is provided so that the squeegee 14 is not movable in the lateral direction. The squeegee 14 is movable along a concave portion 18 for guiding the squeegee of the squeegee pressing tool 13. A length of the squeegee at a position of the heat diffusing plate 2 which is projected from the printed board 4 is reduced by the spring. The squeegee lengths of the portions other than that portion have been extended by the spring. Therefore, the soldering paste can be printed irrespective of the concave and convex portions on the surface. A width of squeegee which has been made fine is determined in accordance with the positions of the pads at which the soldering paste should be printed and it is not always necessary to set the widths of the respective fine squeegee portions to be equal. Although not shown, a mask for printing is interposed between an object to be printed such as a printed board 4 and the squeegee 14. The printing mask has a shape according to the concave and convex portions of the object to be printed. In the invention, as a surface installing package, a total of 24 packages on which semiconductor devices of the SRAM of 1 Mbits having a heat generation amount of maximum 1 W have been installed are used for the front and back surfaces. As a semiconductor device 1, a large scale integrated circuit chip having a heat generation amount of 25 W is used. As mentioned above, in accordance with the invention, an allowable difference in heat generation amounts between the mixed semiconductor devices which are installed in one module is such that the maximum heat generation amount of the semiconductor devices having the maximum heat generation amount corresponds to 20 times or more the heat generation amount of the semiconductor device having the minimum heat generation amount. Although the surface installing packages have been used from a viewpoint of an operating efficiency in the invention, when all of the semiconductor devices to be installed in the module are bar chips, the miniaturization of the module can be further enhanced Embodiment 2

Figure 5A:
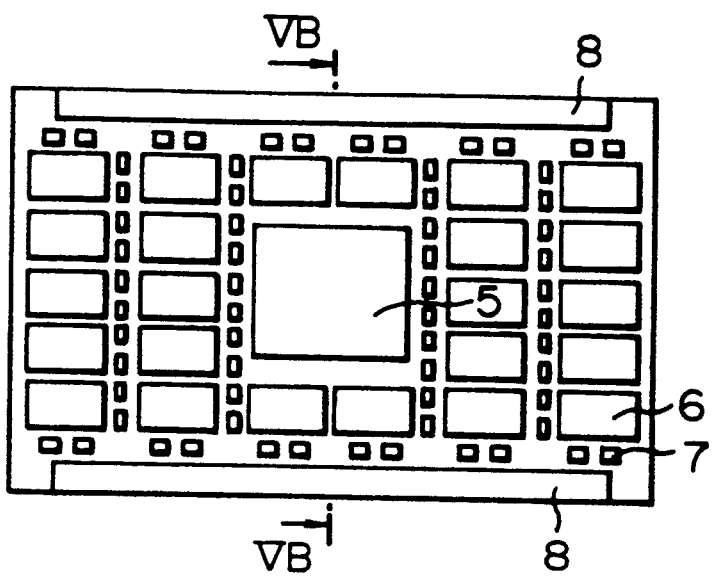
FIG. 5A is a plan view showing a semiconductor apparatus of the second embodiment of the invention.
Figure 5B:
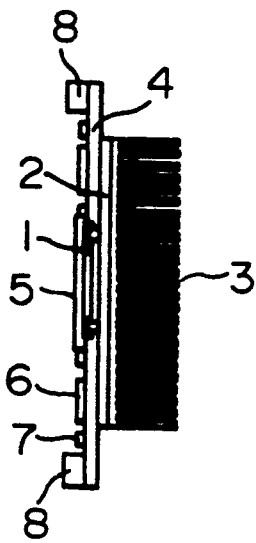
FIG. 5B is a cross sectional view showing the second embodiment of the invention.

FIGS. 5A and 5B are a plan view and a cross sectional view of another module installing type semiconductor apparatus. In a manner similar to the embodiment 1, the semiconductor device 1 is installed at the center of the surface installing printed board 4 and the package for memory and the chip parts are installed on the front and back surfaces around the semiconductor device 1. The connectors 8 are attached to both edges of the printed board 4. In the invention, the printed board 4 is attached to a connector (not shown) on the mother board 19 shown in FIG. 3 in parallel with the mother board. Since the printed board 4 is attached in parallel to the mother board, the printed board 4 can be installed at a short height as compared with the case of the first embodiment in which the printed board 4 is vertically attached. The construction of the embodiment 2 is suitable for a thin-type computer in which there is a limitation in height over the mother board 19. On the other hand, since the connectors 8 are provided at both edges of the printed board 4, as compared with the case of using one connector, a larger number of power source pins and ground pins on the mother board 19 can be set. This is effective to reduce a noise fluctuation of the power source and ground.

Embodiment 3

Figure 6:
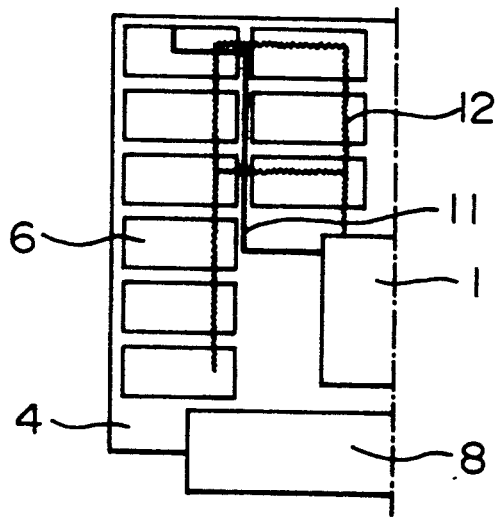
FIG. 6 is a schematic plan view showing a semiconductor apparatus of the third embodiment of the invention.

FIG. 6 is a diagram of the left half of a plan view which is symmetrical with respect to a center axis and shows another module installing type semiconductor apparatus. In a manner similar to the embodiment 1, the semiconductor device 1 is installed at the center of the surface installing printed board 4 and the packages 6 for memory and the chip parts (not shown) are installed to the front and back surfaces around the semiconductor device 1. The packages 6 are arranged so that a difference between wiring lengths of an address wiring 12 and a data wiring 11 for connecting the semiconductor device 1 installed on the heat diffusing plate 2 and the packages 6 installed on the printed board 4 is equal to or less than 10%. In order to reduce the transmission delay of the signal in the semiconductor device 1 and the package 6, it is desirable that the address wiring 12 and data wiring 11 are as short as possible. However, even when only one of the wirings is short, if the other one of the wirings is long, the whole transmission delay time is large because of the signal delay of the other long wiring. According to the invention, since the difference between the wiring lengths of the address wiring and the data wiring of the package 6 locating at the farthest position from the semiconductor device 1 is equal to or less than 10%, a balanced wiring structure is obtained.

Embodiment 4

Figure 7:
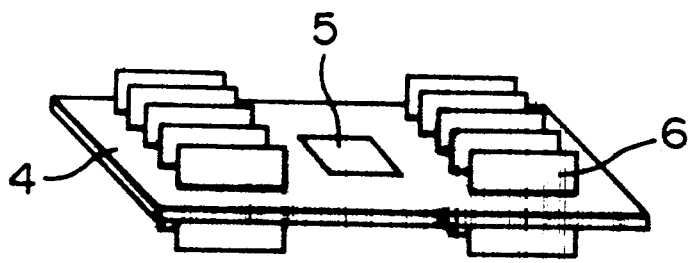
FIG. 7 is a perspective diagrammatical view showing a semiconductor apparatus of the fourth embodiment of the invention.

FIG. 7 is a perspective view of still another module installing type semiconductor apparatus. In a manner similar to the embodiment 1, the semiconductor device 1 is installed at the center of the surface installing printed board 4 and the packages 6 for memory and the chip parts (not shown) are installed to the front and back surfaces around the semiconductor device 1. The packages 6 which are installed onto the printed board 4 are vertically attached to the printed board 4. Since the installation area on the surface of the printed board 4 per one package for memory can be reduced, the installation density of the packages for memory can be raised and the memories for a larger capacity can be installed. Since both of the flat surfaces of the package for memory come into contact with the cooling air, they also function as what is known as cooling fins and the highly integrated memories having a higher heat generation can be installed.

What is claimed is:

1. A semiconductor apparatus of a module installing type having a plurality of semiconductor integrated circuit devices mounted thereon and having different heat generation amounts, comprising:

a printed circuit board made of resin and having at least one through hole;

a plurality of first semiconductor integrated circuit devices mounted on said printed circuit board and having a maximum heat generation amount of less than 5 W, each of said plurality of first semiconductor integrated circuit devices having input terminals and output terminals;

a heat diffusing plate made of metal or ceramics; and at least one second semiconductor integrated circuit device arranged in the through hole of said printed circuit board and also mounted on said heat diffusing plate, each of said at least one second semiconductor integrated circuit device having signal input terminals and output terminals and having a heat generation amount of 5 W or more, wherein signal input terminals and output terminals of said second semiconductor integrated circuit device are electrically connected to signal input terminals and output terminals of at least one of said first semiconductor integrated circuit devices, wherein said heat diffusion plate has radiating fins provided thereon, which extend externally of said printed circuit board, and wherein said printed circuit board is provided with external input and output terminals.

2. An apparatus according to claim 1, wherein said second semiconductor integrated circuit device arranged in said through hole comprises a circuit for producing a logic function, and at least one of said first semiconductor integrated circuit devices mounted on said printed circuit board includes a memory device.

3. An apparatus according to claim 2, wherein said plurality of first semiconductor integrated circuit devices and said at least one second semiconductor integrated circuit device each comprise a semiconductor chip.

4. An apparatus according to claim 1, wherein said plurality of first semiconductor integrated circuit devices and said at least one second semiconductor integrated circuit device each comprise a semiconductor chip.

5. An apparatus according to claim 1, wherein said radiating fins are adhered to said heat diffusing plate by resin.

6. An apparatus according to claim 1, wherein said radiating fins are fixedly secured to said diffusing plate by screws.

7. An apparatus according to claim 6, wherein a heat transfer sheet is interposed between said heat diffusing plate and said radiating fins.

8. An apparatus according to claim 1,
wherein said at least one of said first semiconductor integrated circuit devices includes plural memory chips mounted on said printed circuit board, and
wherein said at least one second semiconductor integrated circuit device consists of at least one logic function type semiconductor chip disposed in the through hole of said printed circuit board, said through hole being centrally located on the board.

9. An apparatus according to claim 8, wherein said radiating fins are adhered to said heat diffusing plate by resin.

10. An apparatus according to claim 8,
wherein said radiating fins are fixedly secured to said diffusing plate by screws, and
wherein a heat transfer sheet is interposed between said heat diffusing plate and said radiating fins.

* * * * *